United States Patent [19]
Jang et al.

[11] Patent Number: 5,789,120
[45] Date of Patent: Aug. 4, 1998

[54] METHOD FOR DESIGNING A RETICLE MASK

[75] Inventors: Ill-Jin Jang; Dong-Chun Kim, both of Soowon, Rep. of Korea

[73] Assignee: Samsung Electronics Co., Ltd., Suwon, Rep. of Korea

[21] Appl. No.: 867,739

[22] Filed: Jun. 3, 1997

[30] Foreign Application Priority Data

Jun. 4, 1996 [KR] Rep. of Korea ............ 96-19737

[51] Int. Cl.$^6$ ............................................. G03F 9/00
[52] U.S. Cl. ............................................. 430/5; 364/488
[58] Field of Search .................................. 430/322, 323, 430/324; 364/488

[56] References Cited

U.S. PATENT DOCUMENTS 5,541,025   7/1996   Oi et al. ....................... 430/5

Primary Examiner—S. Rosasco
Attorney, Agent, or Firm—Jones & Volentine, L.L.P.

[57] ABSTRACT

A method for designing a reticle mask with a reduced pattern by use of another larger reticle mask having a circuit pattern and scribe line patterns on lower and right edges of the circuit pattern. In the method, the larger circuit pattern is modified by forming two dummy scribe line regions at upper and left edges of the larger circuit pattern. The modified mask pattern is then reduced. The reduced mask pattern is repeatedly copied on a reticle frame region, with at least one of the dummy scribe line regions overlapping at least one of the scribe line regions of an adjacent reduced mask pattern.

5 Claims, 3 Drawing Sheets

1

METHOD FOR DESIGNING A RETICLE MASK

BACKGROUND OF THE INVENTION

1. Field of the Invention

The present invention relates to a method for designing a reticle mask used in step-and-repeat reduction projection systems for manufacturing integrated circuit devices, and more particularly, to a method for designing a reticle mask using a computer-aided engineering system such as a computer-aided design (CAD) system.

2. Description of the Related Art

Many integrated circuit devices, typically on the order of hundreds or thousands, are made on a single circularly shaped semiconductor wafer having a diameter of five or eight inches. On.e part of the manufacturing operation is the lithography process where masks are used to transfer optical images onto the semiconductor wafer.

A mask is typically made from a clear glass plate with patterned opaque regions and patterned transparent regions. Light passing through the patterned opaque and transparent regions is then exposed onto the wafer.

A mask can be one of two types. One is a full-field mask, which is used to expose an entire wafer in a single exposure operation. Accordingly, the full field mask has the optical pattern of a particular circuit region repeated throughout the full field mask. Further, there are at least as many circuit patterns on the full field mask as there are circuit regions that are ultimately manufactured on the wafer.

Another type of a mask is called a reticle mask. A reticle mask contains only one or a few circuit patterns. The reticle mask is used in a step-and-repeat reduction projection system which only exposes a specific portion of the semiconductor wafer at a time. The projection system then steps to another portion of the wafer and repeats the process until the entire wafer has been exposed.

Referring to FIG. 1, there is schematically shown an example of a conventional reticle mask having a circuit pattern region which is magnified 5 times (hereinafter referred to as a 5× reticle mask). A rectangularly shaped reticle pattern region 7 is positioned on a center portion of a reticle frame 2. The reticle pattern region 7 includes a circuit pattern region 4 and two scribe line regions 6a and 6b. As shown in FIG. 1, the scribe line regions 6a and 6b are disposed along the lower and right edges of the circuit region 4.

Along the periphery of the reticle frame 2, alignment marks 8a, 8b and 8c are formed to check the accuracy of the mask alignment. In addition, registration marks (not shown) are typically provided to measure the resolution of the patterns.

FIG. 2 shows another example of a conventional reticle mask having a circuit pattern region which is magnified 2.5 times (hereinafter referred to as a 2.5× reticle mask). The 2.5× reticle mask contains six circuit regions 4a, 4b, 4c, 4d, 4e and 4f that are positioned in a two-by-three array with twelve scribe line regions, $6a_1$ through $6a_6$ (rows) and $6b_1$ through $6b_6$ (columns), separating each of the circuit regions. Each of the circuit regions 4a through 4f is congruent to one another, that is, they have the same shape and size, and so do the scribe line regions $6a_1$ through $6a_6$ and $6b_1$ through $6b_6$.

During the lithography process, it is well known that relatively fine and sophisticated patterns are exposed by a projection system using a 5× reticle mask, but relatively unsophisticated patterns are exposed by a projection system using a 2.5× reticle mask, to increase the manufacturing throughput. Of course, the 5× and 2.5× reticle masks should be compatible with the other.

In a conventional method for designing the 2.5× reticle mask on a CAD system, the reticle pattern region 7 of the 5× reticle mask is first reduced by one-half (i.e., 50%) the magnification in the row and column direction. This reduced region is then copied six (6) times on the frame region 2a of the 2.5× reticle mask. The resulting 2.5× mask design (as shown in FIG. 2), has six circuit regions 4a through 4f that are arranged in the two-by-three array with twelve scribe line regions $6a_1$ through $6a_6$ and $6b_1$ through $6b_6$ separating each of the respective circuit regions.

A disadvantage of this conventional method is that there is a possibility of misalignment, caused by the incorrect overlap between circuit pattern regions and scribe line regions. The misalignment causes defective semiconductor devices that must be discarded, resulting in large manufacturing losses.

SUMMARY OF THE INVENTION

The present invention is directed to a method of designing a reticle mask, which substantially overcomes one or more of the problems due to the limitations and disadvantages of the related art.

The present invention provides a method of designing a reticle mask of N-times magnification by using a reticle mask of 2N-times magnification which is surrounded by four scribe line regions, including two dummy scribe line regions, forming a rectangularly shaped grid.

To achieve these and other advantages and in accordance with the purpose of the invention, as embodied and broadly described, the invention provides a method for designing a N-times magnification reticle mask using a 2N-times magnification reticle mask, the 2N reticle mask having a first mask pattern including a circuit pattern region and two scribe line regions, the circuit pattern region being rectangularly shaped and the scribe line regions being positioned adjacent to first and second edges of the circuit pattern region, respectively, the method comprising the steps of:

(A) forming a first dummy line region and a second dummy scribe line region on the first mask pattern, the first and second dummy scribe lines regions being respectively positioned adjacent to third and fourth edges of the circuit pattern region, whereby a first modified mask pattern is obtained; (B) reducing the first modified mask pattern by one-half magnification in each of a row direction and a column direction, whereby a first reduced mask pattern is obtained; (C) forming the first reduced mask pattern on a first portion of a reticle region; (D) copying the first reduced mask pattern to create a second reduced mask pattern; and (E) forming the second reduced mask pattern on one side of the first reduced mask pattern on the reticle region, wherein one of the dummy scribe line regions of the second reduced mask pattern overlaps one of the scribe line regions of the first reduced mask pattern.

The copying and forming steps, that is, steps (D) and (E), may be successively repeated, creating additional reduced mask patterns formed on at least one side of each of the first and second reduced mask patterns, wherein at least one of the dummy scribe line regions of the respective additional reduced mask pattern overlaps a corresponding scribe line region of at least one of the first and second reduced mask patterns.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawing, in which.

DESCRIPTION OF THE PREFERRED EMBODIMENT

Figure 1:
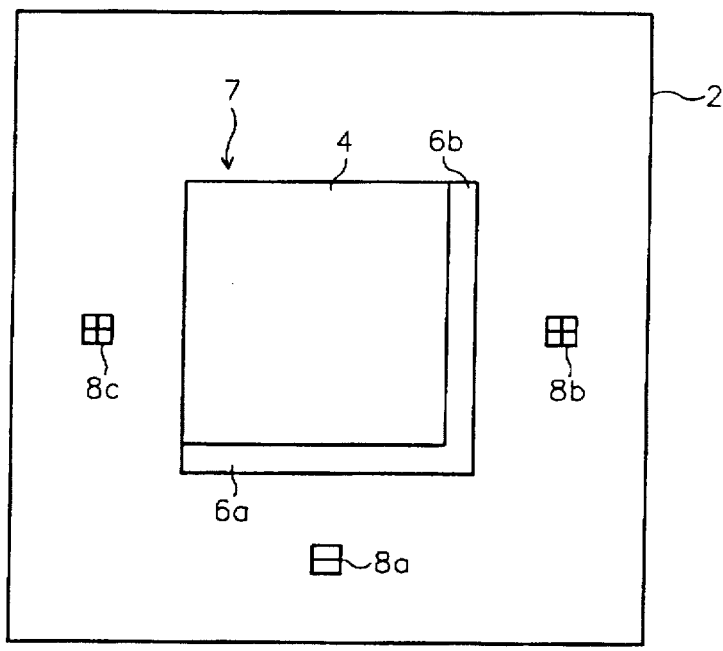
FIG. 1 is a schematic plan view illustrating a conventional 5× reticle mask having two scribe line regions at lower and right edges of a circuit pattern region.
Figure 2:
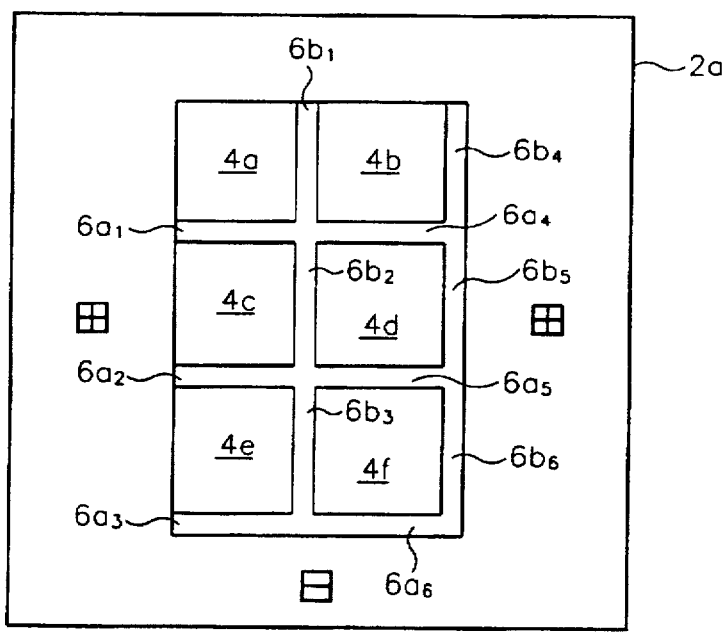
FIG. 2 is a schematic plan view illustrating a conventional 2.5× reticle mask fabricated by using the mask of FIG. 1.

An exemplary embodiment of the invention will now be described with references to FIGS. 3 through 5. In the drawings, like reference characters designate like or corresponding parts.

Figure 3:
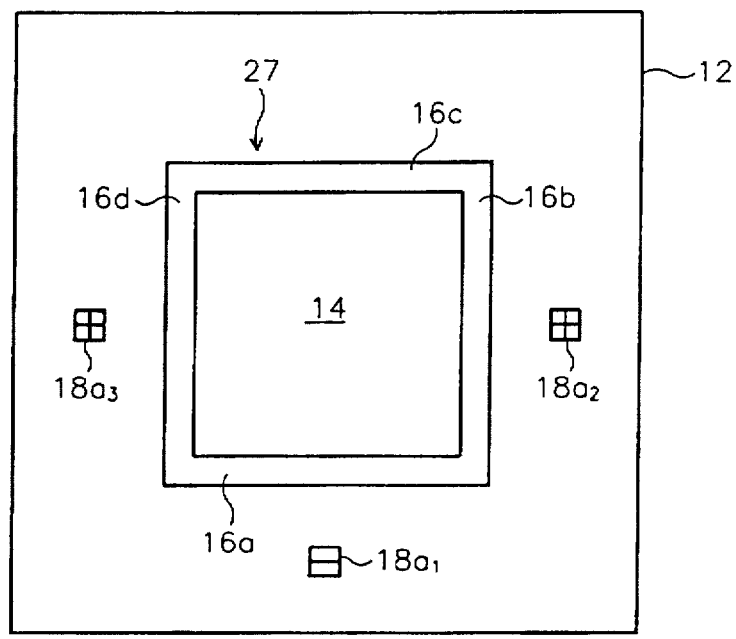
FIG. 3 is a schematic plan view illustrating a 5× reticle mask for designing a 2.5× reticle mask according to present invention.

FIG. 3 shows a 5× reticle mask according to an embodiment of the present invention. Referring to FIG. 3, a rectangularly shaped reticle pattern region 27 of the reticle mask is positioned on a center portion of a reticle frame 12. The reticle pattern region 27 includes a circuit pattern region 14, two scribe line regions 16a and 16b, and two dummy scribe line regions 16c and 16d. As shown in FIG. 3, the scribe line regions 16a and 16b are disposed along the lower and right edges of the circuit region 14. The dummy scribe line regions 16c and 16d are formed along the upper and left edges of the circuit region 14.

It is understood that the method of the present invention described herein may be utilized with scribe line regions and dummy line regions positioned differently around the circuit region 14.

Alignment marks $18a_1$ through $18a_3$ are provided along the periphery of the reticle frame 12 to check the accuracy of the mask alignment. In addition, registration marks (not shown) are provided along the periphery of the reticle frame 12 to measure the resolution of the patterns. The alignment marks and registration marks may also be formed on the scribe lines 16a through 16d.

Figure 4:
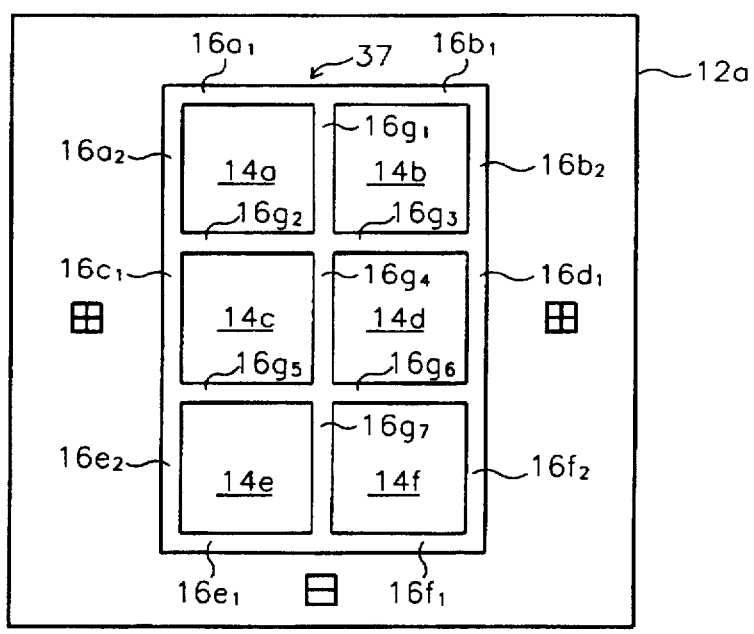
FIG. 4 is a schematic plan view illustrating a 2.5× reticle mask fabricated by using the mask of FIG. 3.

FIG. 4 is a schematic plan view illustrating a 2.5× reticle mask obtained by using the mask of FIG. 3. Referring to FIG. 4, reticle pattern 37 contains six circuit regions 14a, 14b, 14c, 14d, 14e and 14f that are positioned in a two-by-three array with a plurality of scribe line regions $16a_1$, $16a_2$, . . ., $16f_2$, $16g_1$, . . ., $16g_7$. Each of the circuit regions 14a through 14f are separated from each other by certain ones of the scribe line regions $16a_1$, through $16g_7$. Also, the respective circuit regions 14a through 14f are congruent to one another, that is, they have the same shape and size. Further, a group of four scribe line regions (e.g., $16a_1$, $16a_2$, $16g_1$ and $16g_2$) form a rectangularly shaped grid and border the corresponding circuit region (e.g., 14a) Referring to FIGS. 5A through 5D, a method for designing a 2.5× reticle mask (as in FIG. 4) on a computer-aided engineering system, such as a CAD system, according to the present invention will now be described.

First, the conventional 5× reticle mask pattern of FIG. 1 is formed on a display screen of the CAD system. Then, the reticle mask pattern of FIG. 1 is modified by forming two dummy scribe line regions 16c and 16d adjacent to the upper and left edges of the circuit pattern region 14, respectively, as shown in FIG. 3. The modified mask pattern 27 of FIG. 3 is then reduced by one-half the magnification in each of its row and column directions, as denoted by reference numeral 27' shown in FIG. 5A. The reduced mask pattern 27' includes the reduced circuit region 14' and the reduced scribe line regions 16a' through 16d'.

Next, this reduced mask pattern 14a is formed on a portion of the reticle frame 12a shown in FIG. 4. The reduced mask pattern at 14a, surrounded by a rectangularly shaped scribe line regions $16a_1$, $16a_2$, $16g_1$ and $16g_2$, is congruent with the pattern 27' of FIG. 5A, which is obtained by reducing the modified mask pattern 27 by one-half the magnification in each of its row and column directions.

The reduced mask pattern 14a is subsequently copied to produce a second reduced mask pattern 14b, which is then formed, for example, to the right side of the first reduced mask pattern 14a. The second reduced mask pattern 14b is congruent with the first reduced mask pattern 14a. Further, as shown in FIG. 5B, the dummy scribe line region 16d' of the second reduced mask pattern 14b is overlapped with the scribe line region 16b' of the first reduced mask pattern 14a.

Figure 5A:
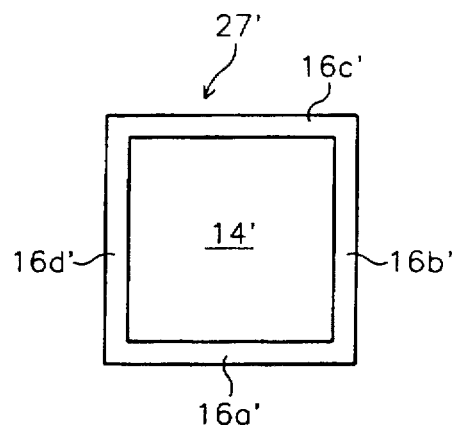
FIGS. 5A, 5B, 5C and 5D are schematic plan views for illustrating a method for designing a reticle mask according to an embodiment of the present invention.
Figure 5B:
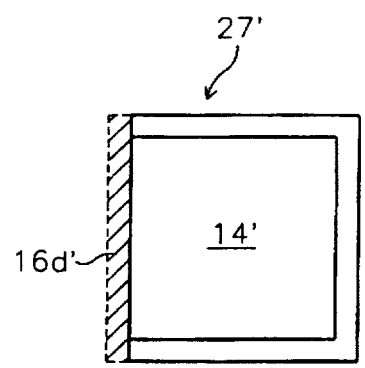
Figure 5C:
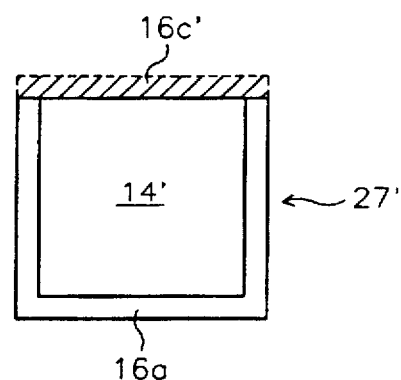
Figure 5D:
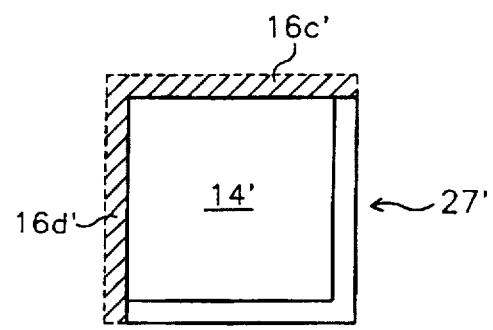

Note that in FIGS. 5B, 5C and 5D, each of portions represented by hatching is a dummy scribe line region of a reduced mask pattern that overlap the scribe line region of one or more adjacent reduced mask patterns. Note also that the reduced mask patterns may be placed on the reticle frame 12a in different sequences.

Returning to FIG. 4, a third reduced mask pattern 14c is formed at the lower side of the first reduced mask pattern 14a. The third reduced mask pattern 14c is congruent with each of the first and second reduced mask patterns 14a and 14b. Referring to FIG. 5C, the dummy scribe line region 16c' of the third reduced mask pattern 14c overlaps the scribe line region 16a' of the first reduced mask pattern 14a.

Then, a fourth reduced mask pattern 14d is formed at the lower side of the second reduced mask pattern 14b and to the right of the third reduced mask pattern 14c. The fourth reduced mask pattern 14d is congruent with each of the reduced mask patterns 14a through 14c. Referring to FIG. 5D, the dummy scribe line regions 16c' and 16d' of the fourth reduced mask pattern 14d overlap the scribe line region 16a' of the second reduced mask pattern 14b and the scribe line region 16b' of the third reduced mask pattern 14c, respectively.

A fifth reduced mask pattern 14e is formed at the lower side of the third reduced mask pattern 14c. The fifth reduced mask pattern 14e is congruent with each of the reduced mask patterns 14a through 14d. Referring back to FIG. 5C, the dummy scribe line region 16c' of the fifth reduced mask pattern 14e overlaps the scribe line region 16a' of the third reduced mask pattern 14c.

Finally, a sixth reduced mask pattern 14f is formed at the lower side of the fourth reduced mask pattern 14d and to the right of the fifth reduced mask pattern 14e. The sixth reduced mask pattern 14f is congruent with each of the reduced mask patterns 14a through 14e. Referring back to FIG. 5D, the dummy scribe line regions 16c' and 16d' of the sixth reduced mask pattern 14f overlap the scribe line region 16a' of the fourth reduced mask pattern 14d, and the scribe line region 16b' of the fifth reduced mask pattern 14e, respectively.

With the above described method, the 2.5× reticle mask of FIG. 4 is fabricated by using the mask of FIG. 3, with the mask of FIG. 3 being a modification of FIG. 1. By providing scribe lines on all four sides of the reduced mask pattern, misalignment caused by the incorrect overlap between circuit pattern regions and scribe line regions is substantially reduced or eliminated. The overlapping dummy scribe lines and scribe lines thus ensure more precise alignment between circuit pattern regions, leading to a greater yield of properly formed semiconductor devices.

While the invention has been described in terms of the embodiments described above, those skilled in the art will recognize that the invention can be practiced with modification within the spirit and scope of the appended claims and their equivalents. For example, the dummy and scribe lines may be positioned differently around the circuit region, and different magnification values may be utilized.

What is claimed is:

1. A method for designing a N-times magnification reticle mask using a 2N-times magnification reticle mask, said 2N reticle mask having a first mask pattern including a circuit pattern region and two scribe line regions, the circuit pattern region being rectangularly shaped and the scribe line regions being positioned adjacent to first and second edges of the circuit pattern region, respectively, the method comprising the steps of:

(A) forming a first dummy line region and a second dummy scribe line region on said first mask pattern, said first and second dummy scribe line regions being respectively positioned adjacent to third and fourth edges of the circuit pattern region, whereby a first modified mask pattern is obtained;

(B) reducing said first modified mask pattern by one-half magnification in each of a row direction and a column direction, whereby a first reduced mask pattern is obtained;

(C) forming the first reduced mask pattern on a first portion of a reticle region;

(D) copying said first reduced mask pattern to create a second reduced mask pattern; and (E) forming the second reduced mask pattern on one side of the first reduced mask pattern on the reticle region, wherein one of the dummy scribe line regions of the second reduced mask pattern overlaps one of the scribe line regions of the first reduced mask pattern.

2. The method of claim 1, wherein said first and second edges are the lower and right edges of the circuit pattern region, and said third and fourth edges are the left and upper edges of the circuit pattern region.

3. The method of claim 2, wherein the second reduced mask pattern is formed on a right side of the first reduced mask pattern on the reticle region, and wherein said first dummy scribe line region of the second reduced mask pattern overlaps the second scribe line region of the first reduced mask pattern.

4. The method of claim 3, wherein said method steps are performed on a computer-aided engineering system.

5. The method of claim 4, further comprising the step of:

(F) forming one or more additional reduced mask patterns by repeating step (D), each additional reduced mask pattern being formed on at least one side of each of the first and second reduced mask patterns, wherein at least one of the dummy scribe line regions of the respective additional reduced mask pattern overlaps a corresponding scribe line region of at least one of the first and second reduced mask patterns.

* * * * *